(12) United States Patent
Kim et al.

(10) Patent No.: US 9,305,804 B2
(45) Date of Patent: Apr. 5, 2016

(54) PLASMA ETCH PROCESSES FOR OPENING MASK LAYERS

(71) Applicant: Applied Materials, Inc., Santa Clara, CA (US)

(72) Inventors: Jong Mun Kim, San Jose, CA (US); Jairaj J. Payyapilly, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/505,138

(22) Filed: Oct. 2, 2014

(65) Prior Publication Data

US 2015/0099367 A1 Apr. 9, 2015

Related U.S. Application Data

(60) Provisional application No. 61/895,729, filed on Oct. 25, 2013, provisional application No. 61/887,608, filed on Oct. 7, 2013.

(51) Int. Cl.
| | |
|---|---|
| H01L 21/302 | (2006.01) |
| H01L 21/461 | (2006.01) |
| B44C 1/22 | (2006.01) |
| C03C 15/00 | (2006.01) |
| C03C 25/68 | (2006.01) |
| C23F 1/00 | (2006.01) |
| H01L 21/311 | (2006.01) |
| H01L 21/3213 | (2006.01) |
| H01J 37/32 | (2006.01) |

(52) U.S. Cl.
CPC ..... *H01L 21/31116* (2013.01); *H01J 37/32091* (2013.01); *H01J 37/32165* (2013.01); *H01L 21/31122* (2013.01); *H01L 21/31144* (2013.01); *H01L 21/32139* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,656,128 | A * | 8/1997 | Hashimoto et al. | 216/47 |
| 2009/0212010 | A1 * | 8/2009 | Wang et al. | 216/47 |
| 2010/0081286 | A1 * | 4/2010 | Kim et al. | 438/710 |
| 2013/0109188 | A1 | 5/2013 | Kim et al. | |

* cited by examiner

*Primary Examiner* — Stephanie Duclair
(74) *Attorney, Agent, or Firm* — Patterson & Sheridan, LLP

(57) ABSTRACT

Implementations described herein generally relate to semiconductor manufacturing and more particularly to the process of plasma etching an amorphous carbon layer. In one implementation, a method of etching a feature in an amorphous carbon layer is provided. The method comprises transferring a substrate including a patterned photoresist layer disposed above the amorphous carbon layer into an etching chamber, exposing the amorphous carbon layer to a fluorine-free etchant gas mixture including a fluorine-free halogen source gas and a passivation source gas and etching the amorphous carbon layer with a plasma of the fluorine-free etchant gas mixture. It has been found that plasma etching with a fluorine-free halogen based gas mixture reduces the formation of top critical dimension clogging oxides.

20 Claims, 4 Drawing Sheets

PLASMA ETCH PROCESSES FOR OPENING MASK LAYERS

CROSS-REFERENCE TO RELATED APPLICATIONS

This application claims benefit of U.S. provisional patent application Ser. No. 61/887,608, filed Oct. 7, 2013 and U.S. provisional patent application Ser. No. 61/895,729, filed Oct. 25, 2013. The aforementioned related patent applications are both incorporated by reference herein in their entirety.

BACKGROUND

1. Field

Implementations described herein generally relate to semiconductor manufacturing and more particularly to the process of plasma etching an amorphous carbon layer.

2. Description of the Related Art

As the feature size of the device patterns get smaller, the critical dimension (CD) requirement of features becomes a more important criterion for stable and repeatable device performance. Allowable CD variation across a substrate has also scaled with the scaling of feature CD. With lateral dimensions scaling faster than vertical dimensions, because of issues such as device capacitance, high aspect ratios (HAR) are now prevalent in the industry. When such demanding aspect ratios and CD control are compounded with requirements of high etch selectivity, sidewall smoothness and high tool throughput, the process window for any hardware configuration can become very small. In many situations, a small process window can be found only when a number of process gases are incorporated into a complex etchant gas mixture combined with extreme hardware settings, such as very high RF bias powers, to achieve a fragile balance between sidewall passivation, etch rate and mask selectivity. However, such small process windows typically suffer from performance limitations which cannot be tuned out of the etch process with known means.

Fabrication techniques often now employ a mask stack that includes non-photo definable material layers disposed below a photo definable layer (i.e., a photoresist). The non-photo definable material layers may include a carbonaceous layer, which may be of an inorganic material comprising at least 20 wt % carbon. Amorphous carbon, typically comprising greater than 50 wt % carbon and low-k dielectrics comprising at least 20 wt % carbon content are included in this class of materials. One example of such a carbonaceous material is available from Applied Materials, Inc. of Santa Clara, Calif. under the name of ADVANCED PATTERNING FILM™ (APF).

Highly reactive oxygen plasma is typically used to etch and pattern the amorphous carbon layer. However, as feature sizes decrease and aspect ratios increase, these highly reactive oxygen plasmas lead to the formation of oxide deposits (e.g., silicon oxide) which often clog or block the top CD causing the etch rate to slow and eventually stop. Currently, oxide deposits are removed using fluoride containing chemistries; however, these fluoride containing chemistries often damage the sidewall passivation present on the amorphous carbon film leading to big bow profiles.

Therefore, there is a need for new processes for etching amorphous carbon films.

SUMMARY

Implementations described herein generally relate to semiconductor manufacturing and more particularly to the process of plasma etching an amorphous carbon layer. In one implementation, a method of etching a feature in an amorphous carbon layer is provided. The method comprises transferring a substrate including a patterned photoresist layer disposed above the amorphous carbon layer into an etching chamber, exposing the amorphous carbon layer to a fluorine-free etchant gas mixture including a fluorine-free halogen source gas and a passivation gas source and etching the amorphous carbon layer with a plasma of the fluorine-free etchant gas mixture.

In another implementation, a method of etching a feature in an amorphous carbon layer is provided. The method comprises transferring a substrate including a patterned photoresist layer disposed above the amorphous carbon layer with a patterned anti-reflective coating layer disposed therebetween into an etching chamber, exposing the amorphous carbon layer to a fluorine-free etchant gas mixture consisting of: chlorine gas, carbonyl sulfide ("COS") and $O_2$ and etching the amorphous carbon layer with a plasma of the fluorine-free etchant gas mixture.

BRIEF DESCRIPTION OF THE DRAWINGS

So that the manner in which the above recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide new approaches for the reduction and elimination of oxide compounds formed in a patterned dielectric anti-reflective coating (DARC) layer by using fluorine-free halogen based gases in a plasma etching process. As feature sizes decrease and aspect ratios correspondingly increase, top-clogging of the DARC layer by oxide compounds formed by the highly reactive oxygen plasma etch of subsequently etched layers blocks the top critical dimension of the patterned DARC layer causing the etch rate to slow and in some cases stop. Current processes use fluorine based chemistries to remove oxide compounds formed on the sidewall of the DARC layer using the fluorine chemistries. These fluorine chemistries remove the oxide clogging compounds but damage the passivation layer used to protect other portions of the mask layer leading to the formation of undesirable bow profiles. Implementations described herein eliminate this fluorine chemistry attack by using fluorine-free halogen based chemistries (e.g., $Cl_2$, HBr, etc.). The halogen based chemistry prevents the deposition of oxide compounds on the sidewall of the DARC layer thus maintaining the top critical dimension to keep the etch depth capability. The implementations described herein are beneficial for, among other things, HAR Mask Open processes over 30:1 aspect ratios for N++3D NAND, 1× Memory DRAM mask open processes.

While the particular apparatus in which the embodiments described herein can be practiced is not limited, it is particularly beneficial to practice the embodiments in an AVATAR™ etch system sold by Applied Materials, Inc., Santa Clara, Calif. Additionally, other available etch systems may also benefit from embodiments described herein.

As used herein, the term "fluorine-free halogen based gas" refers to a halogen based gas that does not contain fluorine and/or fluoride.

Figure 1:
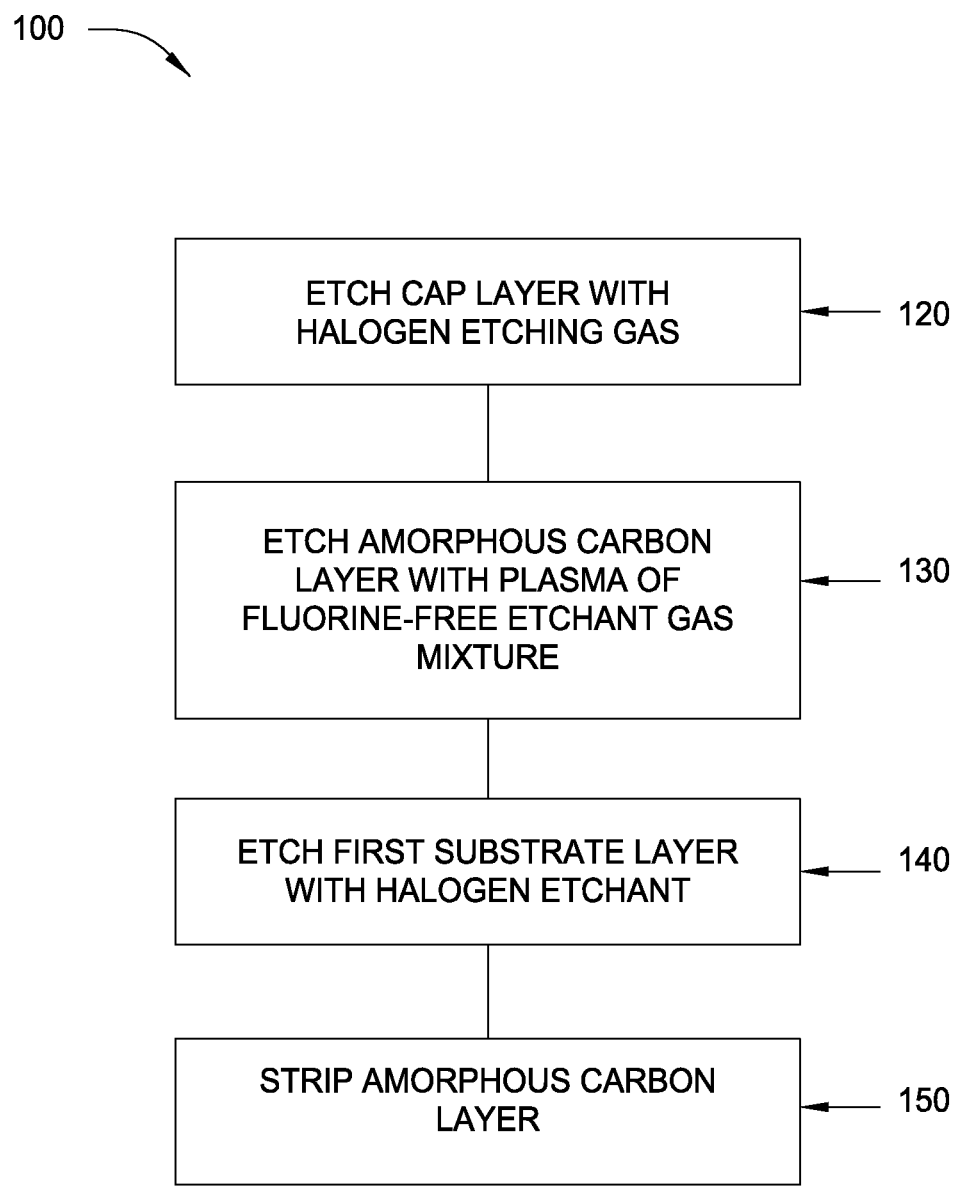
FIG. 1 is a flow chart depicting a method of etching a feature in a multi-layered mask where an amorphous carbon layer of the multi-layered mask is etched with a fluorine-free etchant gas mixture according to some implementations described herein.

FIG. 1 is a flow chart depicting a method of etching a feature in a multi-layered mask where an amorphous carbon layer of the multi-layered mask is etched with a fluorine-free etchant gas mixture according to some implementations described herein. Method 100 is performed upon a substrate during the fabrication process. FIGS. 2A-2F depict cross-sectional schematic views of a workpiece processed according to one implementation of the method of FIG. 1.

Figure 2A:
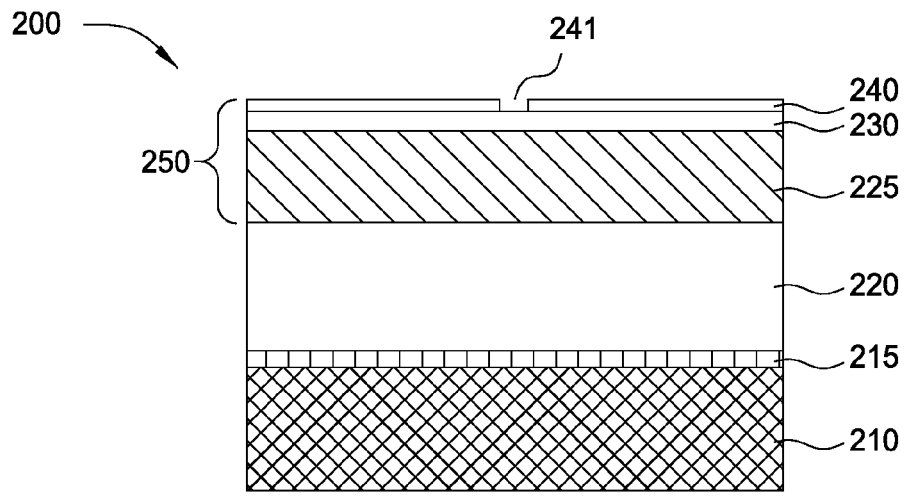
FIGS. 2A-2F depict cross-sectional schematic views of a workpiece processed according to one implementation of the method of FIG. 1, whereby features are etched into a multi-layer mask with a fluorine-free etchant mixture in accordance with some implementations described herein.

The method 100 begins with a workpiece 200, as depicted in FIG. 2A including a substrate layer 220 on a substrate 210. In general, the method 100 is applicable to all HAR contact mask open processes of DRAM, flash memory and logic devices as well as HAR line/space patterns (e.g., for gate line, bit line, interconnect line etches). For example, in DRAM applications, capacitor contact etches, buried contact etches, shallow trench isolation etches may be performed by method 100. In logic device fabrication, small feature size contacts (i.e., <30 nm), shallow trench isolation etches, and line/space etches for double patterning techniques may be performed by method 100.

In one implementation, the substrate 210 is a semiconductor wafer, such as, but not limited to silicon, germanium, or a commonly known III-V compound semiconductor material. In another implementation, substrate 210 is a glass or sapphire material. The substrate layer 220 generally comprises either a dielectric layer or a conductor layer. Dielectric implementations may include a silicon dioxide layer having a dielectric constant of approximately 2.5 or a low-k dielectric material, having a dielectric constant of about 2.4 or below, such as, but not limited to, carbon doped silicon oxides. Conductor implementations included gate materials such as doped polysilicon or commonly employed gate work function metals. It should also be noted that substrate layer 220 may comprise multiple dielectric, semiconductor, or conductor layers of various materials commonly known in the art. In the particular implementation depicted in FIG. 2A, the substrate layer 220 is on an etch stop layer 215, where etch stop layer 215 comprises a material known to have good selectivity to processes employed for etching the substrate layer 220. In one implementation where the substrate layer 220 comprises silicon dioxide, the etch stop layer 215 comprises silicon nitride.

As further depicted, an amorphous carbon layer, such as amorphous carbon layer 225, is formed over the substrate layer 220. The amorphous carbon layer may be formed with spray on/spin on methods, with a thermal deposition process (CVD), or a plasma enhanced deposition process (PECVD). In the implementation depicted in FIG. 2A, the amorphous carbon layer 225 is deposited with either CVD or PECVD to form a carbon material comprising at least 50 wt % carbon with $sp^1$, $sp^2$ and $sp^3$ bonding states giving the film properties which are a hybrid of those typical of pyrolytic, graphitic, and diamond-like carbon. Because the deposited amorphous carbon material may contain a plurality of bonding states in various proportions, it lacks long range order and so is commonly referred to as "amorphous carbon." In particular implementations, the amorphous carbon layer 225 may be formed with a PECVD process using hydrocarbon precursors, such as, but not limited to, methane ($CH_4$), propylene ($C_3H_6$), propyne ($C_3H_4$), propane ($C_3H_3$), butane ($C_4H_{10}$), butylenes ($C_4H_3$), butadiene ($C_4H_6$), acetylene ($C_2H_2$), toluene ($C_7H_8$ ($C_6H_5CH_3$)) and mixtures thereof. The amorphous carbon layer 225 may be doped (e.g., boron doped with a boron source such as diborane ($B_2H_6$)). The amorphous carbon layer 225 may also include nitrogen or other additives. An exemplary amorphous carbon material is commercially available from Applied Materials, Inc., CA, U.S.A. under the trade name Advanced Patterning Film™ (APF).

The amorphous carbon layer 225 is not photosensitive and is instead patterned with a plasma etch to reproduce with high fidelity a pattern of an overlying photosensitive layer. The amorphous carbon layer 225 is formed with a thickness dependent on the material's resistance to the process used to subsequently pattern substrate layer 220 and the structural integrity of the amorphous carbon material (limiting the aspect ratio of the amorphous carbon layer). In one implementation, the amorphous carbon layer 225 has a thickness, which is approximately 3 times greater than the critical dimension of a feature to be subsequently etched into the layer for an aspect ratio of 3:1. In a further implementation, the ratio of amorphous carbon layer thickness to feature dimension is between 1:1 and 4:1. Such a range of ratios will provide adequate structural integrity so that patterned amorphous carbon features will not collapse during subsequent processing. In one such implementation, the amorphous carbon layer 225 is between approximately 100 nm and approximately 1200 nm. In a particular implementation including a substrate layer comprising silicon dioxide approximately 1.5 to 2 um thick, the thickness of the amorphous carbon layer is between approximately 300 nm to 700 nm.

As also depicted in FIG. 2A, the amorphous carbon layer 225 is capped with an inorganic dielectric cap layer 230. The inorganic dielectric cap layer 230 may serve as a dielectric anti-reflective coating layer (DARC) and/or improve adhesion of subsequent organic films applied by spin on techniques, which may otherwise not adhere well to the amorphous carbon layer 225. Inorganic dielectric cap layer 230 may be a single film or a multi-layered stack of films comprising at least silicon and typically further including nitride, oxygen to form a silicon dioxide, silicon nitride or silicon oxy-nitride (SiON). The composition and thickness of the inorganic dielectric cap layer 230 may also be tuned to provide minimal reflections and high contrast for a particular wavelength employed during photolithographic patterning of features. In exemplary implementations, the inorganic dielectric cap layer 230 is formed to a thickness of between about 25 nm and 100 nm, and more particularly between 35 nm and 65 nm.

As further depicted in FIG. 2A, the multi-layered mask 250 includes a patterned photoresist layer 240 after a photolithography operation. In some photoresist implementations, an organic BARC (not depicted) is applied on the inorganic dielectric cap layer 230 to further reduce reflection of light during patterning of the photosensitive layer. The BARC typically comprises polyamides and polysulfones. While it may be unnecessary to have both an organic BARC and the inorganic dielectric cap layer 230 over the amorphous carbon layer 225, some exemplary implementations include a BARC layer.

The patterned photoresist layer 240 over the amorphous carbon layer 225 may be patterned with any conventional means, such as with known photolithography techniques and suitable known resist compositions. In one implementation, the patterned photoresist layer 240 includes a contact opening 241 having a critical dimension below about 30 nm. In one implementation, the patterned photoresist layer 240 forms a contact opening having a critical dimension between approximately 10 nm and 30 nm.

Figure 2B:
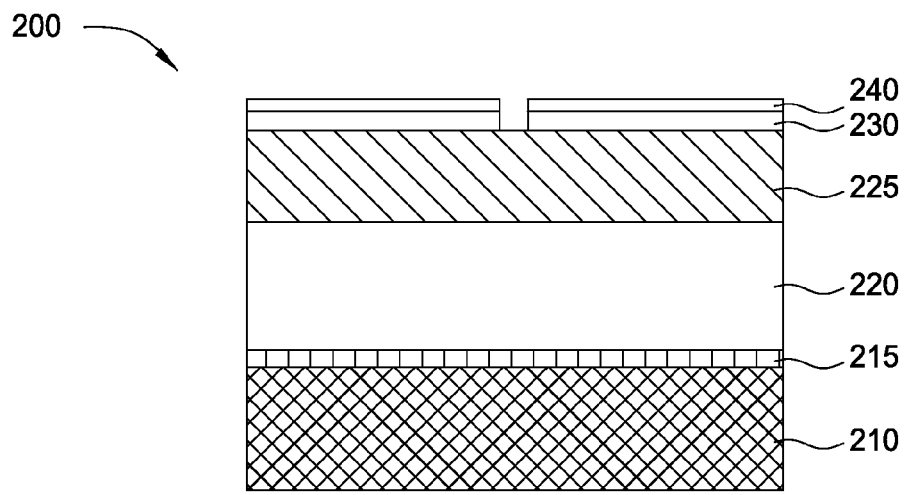
Figure 2C:
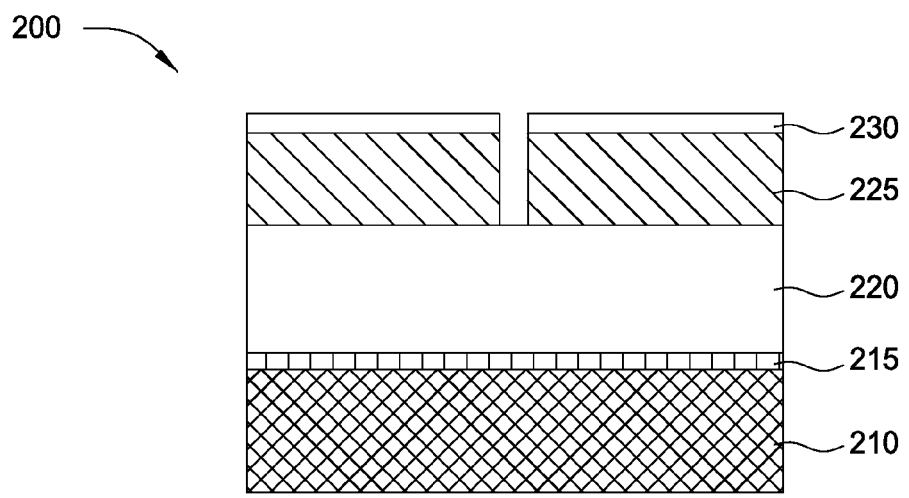
Figure 2D:
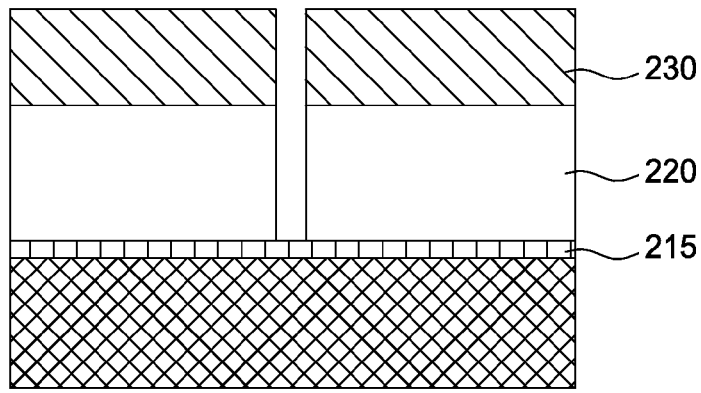
Figure 2E:
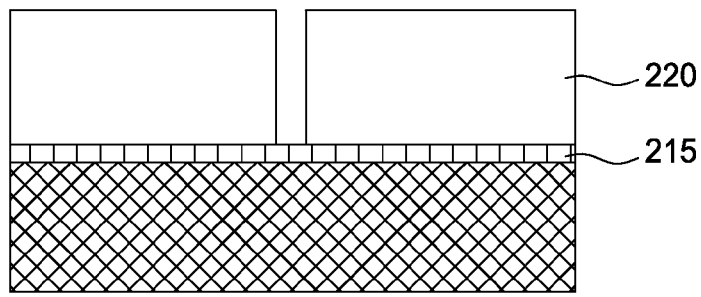

Returning to FIG. 1, at block 120, the inorganic dielectric cap layer 230 is etched as further depicted in FIG. 2B. In one implementation, the inorganic dielectric cap layer 230 is plasma etched with a conventional halogen-based chemistry, including gases such as, but not limited to fluorocarbons including $C_xF_y$ (e.g., $CF_4$, $C_2F_6$, $C_4F_8$, $C_4F_6$, $C_5F_8$, etc.) and/or $C_xH_yF_z$ (e.g., $CHF_3$, $CH_2F_2$, $CHF_3$, etc.) species. Mixtures including one or more of these may be combined with or without $N_2$. In a further implementation, the fluorocarbon etchant gas is energized with a low frequency "bias power" RF generator, having a frequency below about 50 MHz, such as the 13.56 MHz and 2 MHz bands. In a further implementation, high frequency "source power" RF generation, having a frequency above about 100 MHz is preferentially avoided during opening of the inorganic dielectric cap layer 230 to minimize etch bias. A BARC layer, if present, may also be plasma etched with a substantially similar plasma etch process, such that both the organic BARC layer and the inorganic dielectric cap layer 230 may be etched in a single plasma etch process. The duration of operation at block 120 is dependent on the thickness of the cap layer(s), but, in one implementation, a 500 nm inorganic dielectric cap layer 230 is cleared in about 50 seconds.

In the implementation depicted in FIG. 1, at the process of block 130, a fluorine-free etchant gas mixture is employed for etching the inorganic anti-reflective cap and more particularly to plasma etch the amorphous carbon layer 225. The fluorine-free etchant gas mixture comprises one or more fluorine-free halogen based source gases. Exemplary fluorine-free halogen based source gases include chlorine ($Cl_2$), HBr and combinations thereof. The fluorine-free etchant gas mixture may further comprise a passivation gas that primarily serves a sidewall passivation function to reduce undercut and bowing of the etch profile of the amorphous carbon layer 225. Exemplary passivation gases that may be included in the fluorine-free etchant gas mixture include carbonyl sulfide (COS), methane ($CH_4$) and combinations thereof. For implementations where the fluorine-free etchant gas mixture includes a fluorine-free halogen based source gas and a passivation source gas, the fluorine-free halogen based source gas: passivation source gas volumetric gas flow ratio may be between 1:10 and 1:3. In one exemplary implementation, the fluorine-free halogen based source gas may be provided at 10 sccm and the passivation source gas may be provided at 100 sccm. In one exemplary implementation, the fluorine-free halogen based source gas may be provided at 30 sccm and the passivation source gas may be provided at 100 sccm.

In one exemplary implementation, where the fluorine-free halogen based source gas is chlorine gas and the passivation source gas is COS, the chlorine: COS volumetric gas flow ratio may be between 1:10 and 1:3. In one exemplary implementation, chlorine gas may be provided at 10 sccm and COS may be provided at 100 sccm. In one exemplary implementation, chlorine gas may be provided at 30 sccm and COS may be provided at 100 sccm.

In some implementations, the amorphous carbon layer 225 is plasma etched with a fluorine-free etchant gas mixture further including $O_2$. In particular implementations where the fluorine-free etchant gas mixture includes the fluorine-free halogen based source gas, the passivation source gas and $O_2$; a three component mixture may provide an amorphous carbon layer etch process having a large process window. In one particular implementation, the fluorine-free etchant gas mixture comprises, consists essentially of or consists of: 50-200 sccm of COS, 100-1,000 sccm of $O_2$ and 5-100 sccm of $Cl_2$. In one particular implementation, the fluorine-free etchant gas mixture comprises, consists essentially of or consists of: 50-200 sccm of COS, 100-1,000 sccm of $O_2$ and 5-90 sccm of $Cl_2$. In one particular implementation, the fluorine-free etchant gas mixture comprises, consists essentially of or consists of: 50-200 sccm of COS, 100-1,000 sccm of $O_2$ and 5-80 sccm of $Cl_2$. In one particular implementation, the fluorine-free etchant gas mixture comprises, consists essentially of or consists of: 50-200 sccm of COS, 100-1,000 sccm of $O_2$ and 5-70 sccm of $Cl_2$. In one particular implementation, the fluorine-free etchant gas mixture comprises, consists essentially of or consists of: 50-200 sccm of COS, 100-1,000 sccm of $O_2$ and 5-60 sccm of $Cl_2$. In one particular implementation, the fluorine-free etchant gas mixture comprises, consists essentially of or consists of: 50-200 sccm of COS, 100-1,000 sccm of $O_2$ and 5-50 sccm of $Cl_2$. In one particular implementation, the fluorine-free etchant gas mixture comprises, consists essentially of or consists of: 50-200 sccm of COS, 100-1,000 sccm of $O_2$ and 5-40 sccm of $Cl_2$. In one particular implementation, the fluorine-free etchant gas mixture comprises, consists essentially of or consists of: 50-200 sccm of COS, 100-1,000 sccm of $O_2$ and 5-30 sccm of $Cl_2$. In one particular implementation, the fluorine-free etchant gas mixture comprises, consists essentially of or consists of: 100-150 sccm of COS, 750-900 sccm of $O_2$ and 10-15 sccm of $Cl_2$. In one particular implementation, the fluorine-free etchant gas mixture comprises, consists essentially of or consists of: 100 sccm of COS, 800 sccm of $O_2$ and 10 sccm of $Cl_2$. In one particular implementation, the fluorine-free etchant gas mixture comprises, consists essentially of or consists of: 100 sccm of COS, 800 sccm of $O_2$ and 20 sccm of $Cl_2$. In one particular implementation, the fluorine-free etchant gas mixture comprises, consists essentially of or consists of: 100 sccm of COS, 800 sccm of $O_2$ and 30 sccm of $Cl_2$. In one particular implementation, the fluorine-free etchant gas mixture comprises, consists essentially of or consists of: 100 sccm of COS, 800 sccm of $O_2$ and 40 sccm of $Cl_2$.

While three component fluorine-free etchant gas mixture implementations provide a significant reduction in sidewall bowing of HAR contacts in amorphous carbon layers, in further implementations, the fluorine-free etchant gas mixture further comprises $N_2$, for example 10-100 sccm $N_2$ in a mixture further including 50-200 sccm of COS, 100-1,000 sccm of $O_2$ and 5-100 sccm of $Cl_2$. In one particular implementation, the fluorine-free etchant gas mixture comprises, consists essentially of or consists of: 10-100 sccm $N_2$ in a mixture further including 50-200 sccm of COS, 100-1,000 sccm of $O_2$ and 5-30 sccm of $Cl_2$. It is also noted that in alternate embodiments, the $N_2$ source may be replaced with other nitrogen sources, such as, but not limited to nitrogen oxides (NO, $N_2O$, etc.) or ammonia ($NH_3$). The etchant gas mixture may further include Ar, for example 0-500 sccm. Ar improves etch profile however, reduces the etch rate of the amorphous carbon layer 225 relative to the etch rate of the inorganic dielectric cap layer 230 (i.e., reduced selectivity). Inert gases other than Ar, such as He, or Xe may also be used in place of Ar.

In some implementations, the process pressure is low to reduce undercut and bowing of the amorphous carbon layer 225. In some implementations, the process pressure is at or below 50 mTorr (e.g., between 10 mTorr and 50 mTorr). In some implementations, the process pressure is at or below 40 mTorr (e.g., between 10 mTorr and 40 mTorr). In some implementations, the process pressure is at or below 30 mTorr (e.g., between 10 mTorr and 30 mTorr). In some implementations, the process pressure is at or below 20 mTorr (e.g., between 10 mTorr and 20 mTorr). In some implementations, the process pressure is between 10 mTorr and 30 mTorr. In one such implementation, a plasma of a fluorine-free gas mixture including 50-200 sccm of COS, 100-1,000 sccm of $O_2$ and 5-100 sccm of $Cl_2$ is maintained at a pressure at or below 20 mTorr. In another such implementation, a plasma of a fluorine-free gas mixture including 50-200 sccm of COS, 100-1,000 sccm of $O_2$ and 5-30 sccm of $Cl_2$ is maintained at a pressure at or below 20 mTorr.

In further implementations the substrate is maintained at a temperature of between −20° C. and 30° C. and more particularly between 0° C. and 20° C. throughout the etch of the amorphous carbon layer 225. These low process temperatures have been found to significantly improve the etch profile (e.g., reducing bowing) in the amorphous carbon layer 225. In some implementations, the substrate is maintained at a temperature of between 0° C. and 15° C. In some implementations, the substrate is maintained at a temperature of between 5° C. and 15° C. In one exemplary implementation, a plasma of a fluorine-free gas mixture including 50-200 sccm of COS, 100-1,000 sccm of $O_2$ and 5-100 sccm of $Cl_2$ is maintained at a pressure at or below 20 mTorr while the substrate is between 5° C. and 15° C. throughout the etch of the amorphous carbon layer 225. In another exemplary implementation, a plasma of a fluorine-free gas mixture including 50-200 sccm of COS, 100-1,000 sccm of $O_2$ and 5-30 sccm of $Cl_2$ is maintained at a pressure at or below 20 mTorr while the substrate is between 5° C. and 15° C. throughout the etch of the amorphous carbon layer 225.

In some implementations, at least one RF generator operating at 2 MHZ, 60 MHz, or 162 MHz energizes the gas mixture into a plasma during the etching of the amorphous carbon layer 225. The RF energy may be CW (continuous wave) or pulsed at 10-100 KHz pulse frequency. For implementations employing two or more RF energy sources (generators), one RF generator may be pulsed (single) or more of the RF generators may be pulsed (synchronized). In one implementation including both a 2 MHz and 60 MHz, bottom (bias) power source and 162 MHz top (source) power source, the 2 MHz generator may be operated to output 0-1000 W in CW, single pulse mode, or synchronized pulse mode while the 60 MHz generator is operated to output 0-3000 W in CW, single pulse, or synchronized pulse mode. In a further implementation, both the 2 MHz and the 60 MHz output more than 0 W of power. In further implementations, the 162 MHz source power is operated at 0-2500 W with CW, single pulse mode or synchronized pulse mode. For implementations including a high frequency RF excitation of fluorine-free halogen based species/COS/$O_2$ etchant mixtures has been found to provide particularly high amorphous carbon etch rates and high selectivity to materials such as the inorganic dielectric cap layer 230. As used herein, high frequency RF refers to "source" powers operating at RF frequencies above about 100 MHz. Low frequency "source" powers operating at RF frequencies at about 60 MHz and below generally provide a significantly lower etch rate of boron-doped amorphous carbon layers than do high frequency sources. The lower etch rate associated with these low RF frequencies in turn may require compensation with, for example, higher $O_2$ flows and high RF powers. As discussed elsewhere herein, both high $O_2$ flow and high powers at low RF frequency are detrimental to maintaining high selectivity to materials such as the inorganic dielectric cap layer 230 and also detrimental to good CD control. Thus, while the fluorine-free halogen based gas mixtures described herein are generally applicable to any frequency system and may offer improvements relative to other gas mixtures, implementations where the fluorine-free halogen based gas mixture is combined with high frequency RF may offer a superior process window.

Returning to FIG. 1, at the process of block 140, the main etch is performed using the multi-layered mask patterned by implementations described herein. The main etch uses the multi-layered mask to faithfully transfer a feature formed in the amorphous carbon layer 225 into the substrate layer 220, as further shown in FIG. 2E. Depending on the film, various known etch techniques and chemistries may be employed in the main etch, such as, but not limited to, a fluorocarbon-based or chlorofluorocarbon-based plasma etch of a nitride, oxide, semiconductor, or metal substrate film. In one implementation, the substrate film is defined with features below 30 nm using the multi-layered mask. In one such implementation, the fluorocarbon includes the $C_xF_y$ or $C_xH_yF_z$ species utilized to etch in the boron-doped amorphous carbon layer 225, however in some implementations, COS and the fluorine-free halogen source gas are not utilized during the main etch. Furthermore, the flow rate of the $C_xF_y$ or $C_xH_yF_z$ species, plasma process pressure, and/or power levels may be further adjusted from those employed during the mask open process (i.e., during the etching of the amorphous carbon layer 225).

At the process of block 150, an ashing or stripping process is used to remove the remainder of the multi-layered mask. In one implementation, an in-situ strip process is performed in the same etching chamber utilized for the processes of blocks 120, 130, and 140. In a further implementation, a high flow of $O_2$ and a relatively lower flow of a $C_xF_y$ or $C_xH_yF_z$ species 0-50 sccm (and no fluorine-free halogen source gas or COS), is energized with a high frequency source above about 100 MHz with a power of at least 300 W while a low frequency bias power is less than 150 W. As discussed elsewhere herein, the high frequency source power will erode the amorphous carbon layer 225 at a rate not possible with low RF frequencies, such as below about 60 MHz. The in-situ strip also prepares the chamber to repeat method 100 on a subsequent substrate by removing any history effect caused by the main etch of the substrate layer 220.

Figure 2F:
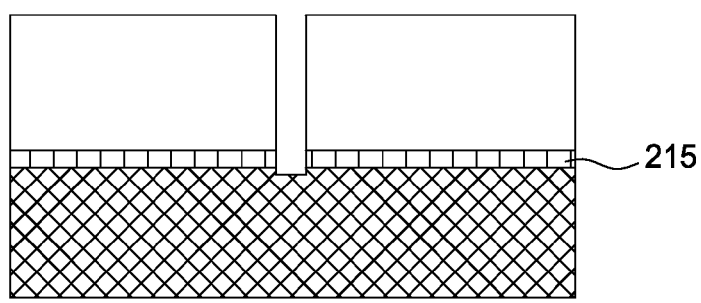

Following the amorphous carbon strip operation performed at block 150, method 100 of FIG. 1 is substantially completed and the substrate available for further processing, perhaps in the same etching chamber utilized for the processes of blocks 130, 140 and 150. In a particular implementation, as depicted in FIG. 2F, an etch stop layer 215 is etched in the same etching chamber as utilized for operation of block 150 to expose an underlying layer after the amorphous carbon layer 225 has been removed. In other implementations, the substrate may be processed as conventional in the art after completion of method 100 in FIG. 1.

Figure 3:
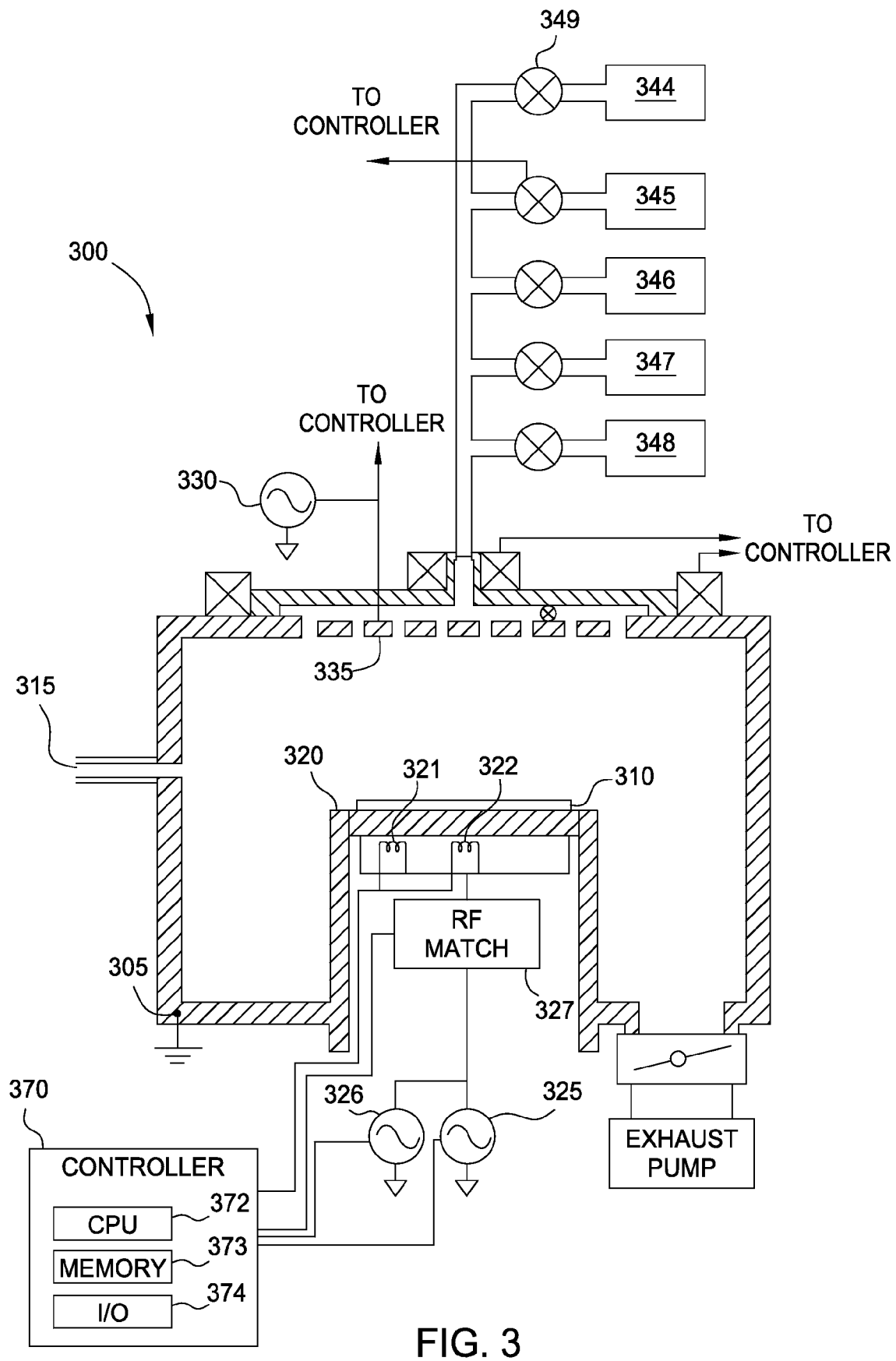
FIG. 3 depicts a cross-sectional schematic view of a plasma etch apparatus adapted to perform the etching methods described herein.

FIG. 3 depicts a cross-sectional schematic view of an exemplary multi-frequency etching chamber 300 adapted to perform the etching methods described herein. The etching chamber 300 includes a grounded chamber body 305. A substrate 310 is transferred into the etching chamber 300 through an opening 315 and clamped to a temperature controlled cathode 320. In particular embodiments, the temperature controlled cathode 320 includes a plurality of zones, each zone independently controllable to a temperature setpoint, such as with a first thermal zone 322 proximate a center of substrate 310 and a second thermal zone 321 proximate to a periphery of substrate 310. Process gases, are supplied from gas sources 344, 345, 346, 347 and 348 through respective mass flow controllers 349 to the interior of the chamber body 305.

When RF power is applied, a plasma is formed in the chamber processing region over the substrate 310. Bias power RF generator 325 is coupled to the temperature controlled cathode 320. The bias power RF generator 325 provides bias power to further energize the plasma. The bias power RF generator 325 typically has a low frequency, and in particular implementations is 13.56 MHz, or 60 MHz. In certain implementations where the bias power RF generator 325 operates at 60 MHz, another bias power RF generator 326 operates at a frequency at about the 2 MHz band which is connected to the same RF match 327 as bias power RF generator 325. The source power RF generator 330 is coupled through a match (not depicted) to a plasma generating element 335 which may be anodic relative to the temperature controlled cathode 320 to provide high frequency source power to energize the plasma. The source power RF generator 330 typically has a higher frequency than the bias power RF generator 325, such as between 100 and 180 MHz, and in a particular implementation, is in the 162 MHz band. The bias power affects the bias voltage on the substrate 310, controlling on bombardment of the substrate 310, while the source power affects the plasma density relatively independently of the bias on the substrate 310. It is noted that the etch performance of a given set of input gases from which the plasma is generated varies significantly with a plasma density and wafer bias. Because substrate diameters have progressed over time, from 150 mm, 200 mm, 300 mm, etc., it is common in the art to normalize the source and bias power of the plasma etching chamber to the substrate area.

The controller 370 may be one of any form of general-purpose data processing system that can be used in an industrial setting for controlling the various subprocessors and subcontrollers. Generally, the controller 370 includes a central processing unit (CPU) 372 in communication with memory 373 and input/output (I/O) circuitry 374, among other common components. Software commands executed by the CPU 372 cause, for example, loading of the substrate into a plasma etching chamber, introduce an etchant gas mixture including $O_2$, fluorine-free halogen gas and COS, into the plasma etching chamber and etch an amorphous carbon layer with a plasma of the etchant gas mixture. Other processes, such as etching an inorganic dielectric cap layer over an amorphous carbon layer and etching a silicon dioxide dielectric under the amorphous carbon layer, in accordance with implementations described herein, may also be executed by the controller 370.

EXAMPLES

Advantages of the embodiments described herein are further illustrated by the following non-limiting examples. The particular materials and amounts thereof, as well as other conditions and details, recited in these examples should not be used to limit the embodiments described herein.

A 300 mm silicon wafer having a multi-layer mask comprising about 1163 nm of an amorphous carbon layer, 45 nm of silicon oxynitride, 20 nm of an anti-reflective coating and a patterned photoresist was provided. The feature diameter was about 90 nm. The wafer was positioned in an etching chamber similar to the etching chamber depicted in FIG. 3.

Example 1

Control

The multi-layer mask was etched without chlorine using a plasma of a fluorine-free etchant gas mixture consisting of: 50-200 sccm of COS and 100-1,000 sccm of $O_2$. For the control which was performed without flowing chlorine, silicon oxide deposits were not removed from the top critical dimension and no holes were opened.

Example 2

10 sccm $Cl_2$

The multi-layer mask was etched with using a plasma of a fluorine-free etchant gas mixture consisting of: 50-200 sccm of COS, 100-1,000 sccm of $O_2$ and 10 sccm of $Cl_2$. For Example 2 which was performed while flowing 10 sccm of $Cl_2$, silicon oxide deposits were removed from the top critical dimension and holes were opened.

Example 3

20 sccm $Cl_2$

The multi-layer mask was etched with using a plasma of a fluorine-free etchant gas mixture consisting of: 50-200 sccm of COS, 100-1,000 sccm of $O_2$ and 20 sccm of $Cl_2$. For Example 3 which was performed while flowing 20 sccm of $Cl_2$, flowing chlorine, silicon oxide deposits were removed from the top critical dimension and holes were opened; however, some undesirable removal of the SiON portion of the mask was also present.

Example 4

30 sccm $Cl_2$

The multi-layer mask was etched with using a plasma of a fluorine-free etchant gas mixture consisting of: 50-200 sccm of COS, 100-1,000 sccm of 07 and 30 sccm of $Cl_2$. For Example 4 which was performed while flowing 30 sccm of $Cl_2$, flowing chlorine, silicon oxide deposits were removed from the top critical dimension and holes were opened; however, some undesirable removal of the SiON portion of the mask was also present.

While the foregoing is directed to implementations of the present disclosure, other and further implementations of the present disclosure may be devised without departing from the basic scope thereof, and the scope thereof is determined by the claims that follow.

We claim:
1. A method of etching a feature in an amorphous carbon layer, the method comprising:
transferring a substrate including a patterned photoresist layer disposed above the amorphous carbon layer into an etching chamber;
exposing the amorphous carbon layer to a fluorine-free etchant gas mixture including a fluorine-free halogen source gas and a passivation source gas; and
etching the amorphous carbon layer with a plasma of the fluorine-free etchant gas mixture, wherein etching the amorphous carbon layer with the plasma of the fluorine-free etchant further comprises:
maintaining the substrate at a temperature between −20° C. and 30° C.;
maintaining the plasma of the fluorine-free etchant gas mixture at a pressure at or below 20 mTorr; and
pulsing at least one RF power energizing the plasma at a frequency of 10-100 KHz.

2. The method of claim 1, wherein the fluorine-free halogen source gas is selected from the group consisting of: chlorine ($Cl_2$) and HBr.

3. The method of claim 2, wherein the passivation source gas is selected from the group consisting of: carbonyl sulfide (COS) and methane ($CH_4$).

4. The method of claim 1, wherein the fluorine-free etchant gas mixture further comprises oxygen ($O_2$).

5. The method of claim 1, wherein
the temperature is between 5° C. and 15° C.

6. The method of claim 1, wherein the fluorine-free etchant gas mixture comprises 50-200 sccm of COS, 100-1,000 sccm of $O_2$, and 5-100 sccm of $Cl_2$.

7. The method of claim 1, wherein the fluorine-free etchant gas mixture comprises 5-30 sccm of $Cl_2$.

8. The method of claim 7, wherein the fluorine-free etchant gas mixture comprises 5-15 sccm of $Cl_2$.

9. The method of claim 1, wherein the substrate further includes a patterned anti-reflective coating layer positioned between the amorphous carbon layer and the patterned photoresist.

10. The method of claim 9, wherein the substrate further includes a patterned silicon oxynitride layer positioned between the patterned anti-reflective coating layer and the amorphous carbon layer.

11. The method of claim 10, wherein etching the amorphous carbon layer further comprises removing silicon oxide deposits from a sidewall of the feature.

12. The method of claim 11, wherein the silicon oxide deposits are formed at the interface of the patterned silicon oxynitride layer and the amorphous carbon layer.

13. The method of claim 1, further comprising etching the substrate layer exposed by an opening formed by the etching of the amorphous carbon layer.

14. The method of claim 1, wherein the pressure is between 10 mTorr and 20 mTorr.

15. A method of etching a feature in an amorphous carbon layer, the method comprising:
transferring a substrate including a patterned photoresist layer disposed above the amorphous carbon layer with a patterned anti-reflective coating layer disposed therebetween into an etching chamber;
exposing the amorphous carbon layer to a fluorine-free etchant gas mixture consisting of:
5-30 sccm of chlorine gas;
50-200 sccm of carbonyl sulfide ("COS"); and
100-1,000 sccm of $O_2$; and
etching the amorphous carbon layer with a plasma of the fluorine-free etchant gas mixture, wherein etching the amorphous carbon layer with the plasma of the fluorine-free etchant comprises:
maintaining the substrate at a temperature between −20° C. and 30° C.; and
maintaining the plasma of the fluorine-free etchant gas mixture at a pressure at or below 20 mTorr.

16. The method of claim 15, wherein the temperature is between 0° C. and 15° C.

17. The method of claim 15, wherein the fluorine-free etchant gas mixture consists of: 5-15 sccm of $Cl_2$.

18. The method of claim 17, wherein etching the amorphous carbon layer further comprises removing silicon oxide deposits from a sidewall of the feature.

19. The method of claim 15, wherein the pressure is between 10 mTorr and 20 mTorr.

20. The method of claim 15, wherein the substrate further includes a patterned silicon oxynitride layer positioned between the patterned anti-reflective coating layer and the amorphous carbon layer.

* * * * *